US006904375B1

(12) United States Patent
Sabih et al.

(10) Patent No.: US 6,904,375 B1
(45) Date of Patent: Jun. 7, 2005

(54) METHOD AND CIRCUITS FOR TESTING HIGH SPEED DEVICES USING LOW SPEED ATE TESTERS

(75) Inventors: Sabih Sabih, Austin, TX (US); Jari Vahe, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 73 days.

(21) Appl. No.: 10/348,999

(22) Filed: Jan. 22, 2003

(51) Int. Cl.$^7$ .............................................. G01R 22/00
(52) U.S. Cl. ...................... 702/75; 702/117; 324/511; 324/537
(58) Field of Search ........................ 702/58–59, 75–76, 702/81, 85, 62, 104, 106, 117, 120, 182, 189; 324/73.1, 511, 537, 750, 763, 765, 609–610, 725; 714/724–727, 738, 744

(56) References Cited

U.S. PATENT DOCUMENTS

| 5,307,284 | A | * | 4/1994 | Brunfeldt et al. ............ 702/76 |
| 5,337,262 | A | * | 8/1994 | Luthi et al. .................. 702/83 |
| 6,049,212 | A | * | 4/2000 | Oldfield ...................... 324/648 |
| 6,243,841 | B1 | * | 6/2001 | Mydill ........................ 714/724 |
| 6,424,926 | B1 | * | 7/2002 | Mak ............................ 702/117 |
| 6,675,339 | B1 | * | 1/2004 | Lanier et al. ............... 714/744 |
| 2003/0084388 | A1 | * | 5/2003 | Williamson et al. ........ 714/725 |

OTHER PUBLICATIONS

Joseph et al., "The Testing of Superconductive ADCs in Software–Defined Radio Base Stations", 2001, Proceeding of the ProRISC, pp. 428–435.*

Vengatachalam et al., "TAN: A Packet Switched Network for VLSI Testing", Oct. 2003, Computer Communications and Networks, 2003: ICCCN 2003. Proceedings. The–12th International Conference on, pp. 605–608.*

Shi et al., "A 2.4 V, 700 $\mu$W, 0.18 mm2 second–order demodulator for high–resolution $\Sigma\Delta$ DACs", May 1997, Custom Integrated Circuits Conference Proceedings of the IEEE 1997, pp. 297–300.*

Xilinx, Inc., "Virtex–E High–Performance Differential Solutions: Low Voltage Differential Signaling (LVDS)," pp. 1–8, Sep. 28, 2000, VTT009 (v1.2), available from Xilinx, Inc., 2100 Logic Drive, San Jose, CA 95124.

* cited by examiner

*Primary Examiner*—Marc S. Hoff
*Assistant Examiner*—Mary Catherine Baran
(74) *Attorney, Agent, or Firm*—Arthur J. Behiel; LeRoy D. Maunu; Justin Liu

(57) ABSTRACT

A bridge circuit disposed between a device under test (DUT) and conventional automatic test equipment (ATE) extends the performance of the ATE. The bridge circuit allows the ATE to test ICs capable of operating at frequencies above the ATE's normal performance limits. In some embodiments, the bridge circuit also extends ATE functionality, providing frame alignment and automatic test-vector generation, for example, and can increase the number of available test channels.

30 Claims, 3 Drawing Sheets

METHOD AND CIRCUITS FOR TESTING HIGH SPEED DEVICES USING LOW SPEED ATE TESTERS

FIELD OF THE INVENTION

The invention relates to methods and circuits for integrated-circuit testing.

BACKGROUND

Integrated circuit (IC) manufacturers rigorously test their ICs to guarantee functionality, performance, and compliance with various industry standards. IC manufacturers employ automated test equipment (ATE) to perform the requisite tests.

An ATE's test capability is limited by the ATE's maximum operating frequency and the number of terminals. As technology advances, faster and more complex ICs often exceed the ATE's test capabilities. In such cases, the IC manufacturer may be forced to upgrade to a more expensive ATE, or rely upon sub-optimal testing.

The demand for ever-faster network speed has led to rapid development and production of ICs with data rates that far exceed the capability of today's fastest testers. For example, computer-based interface ICs for network processing have data rates ranging from 0.8 Gbps to 3 Gbps, and communication interface ICs have data rates in excess of 4.0 Gbps. Testing such ICs requires very advanced—and consequently very expensive—ATEs. In some cases, sufficiently powerful ATEs may not be available at any price. There is therefore a need for methods and systems that provide exhaustive, high-speed testing, and preferably at a reduced price.

SUMMARY

The present invention addresses the need of IC manufacturers to test next-generation ICs exhaustively and economically. The invention proposes a method of extending ATE performance to facilitate testing of ICs operating well beyond an ATE's normal performance limits. In one embodiment, a high-speed bridge placed between the ATE and a device under test (DUT) increases the speed performance and functionality as compared with the ATE operating alone.

The bridge captures test vectors from the ATE at one frequency and delivers the test vectors to a DUT at a required higher frequency. The DUT's output is then captured by the bridge at the higher frequency and stepped down for transmission to the ATE. In some embodiments, the bridge implements additional functionality to improve test speed and coverage. The bridge can also provide additional test channels if the ATE has fewer than the number required for a desired test.

The allowed claims, and not this summary, define the scope of the invention.

DETAILED DESCRIPTION

Figure 1:
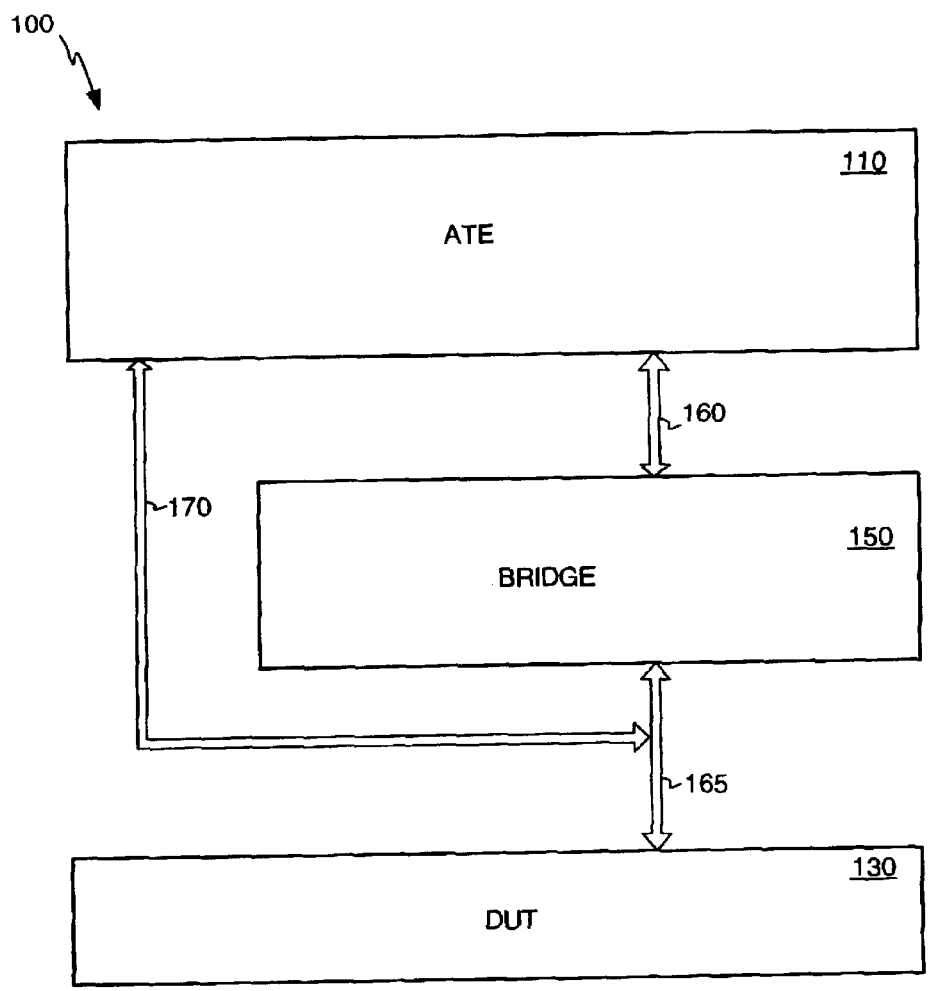
FIG. 1 is a block diagram of a test configuration in which a bridge is disposed between a DUT and an ATE.

FIG. 1 is a block diagram depicting a test configuration 100 that allows a conventional ATE 110 to test a device under test (DUT) 130 capable of communicating data at a test frequency higher than the maximum test frequency afforded by ATE 110.

Test configuration 100 includes a bridge circuit 150, or "bridge," disposed between ATE 110 and DUT 130. Bridge 150 receives test vectors from ATE 110 over a first test interface 160 that operates at a first test frequency. Bridge 150 then communicates these test vectors to DUT 130 over a second test interface 165 at a second test frequency. The second test frequency is typically higher than the first, and can be higher than the maximum operating frequency of ATE 110. A third test interface 170 extending between ATE 110 and interface 165 provides low-frequency (e.g., DC) test signals to facilitate DC measurements of input/output circuitry in DUT 130. The individual test connections of X interfaces 160 and 165 are conventionally referred to as "test channels."

In one embodiment, bridge 150 is a programmable logic device (PLD) on which are instantiated Verilog™ modules defining the bridge. PLDs are attractive for implementing complex modules due to their speed, immense programmable resources, and advanced functional features. The advanced functional features of interest here include configurable memory, double data rate registers, FIFO registers, I/O signal translators, and clock managers.

Bridge 150, taking advantage of some of these advanced features, receives test data from ATE 110 at a single data rate (SDR) and transmits the same test data to DUT 130 at a double data rate (DDR). The translation from single to double data rates doubles the effective maximum test frequency of ATE 110. Likewise, bridge 150 receives test data from DUT 130 at a double data rate and transmits it to ATE 110 at a single data rate. Also important, as detailed below, bridge 150 expedites testing by providing real-time data processing using programmable logic and memory resources.

Figure 2:
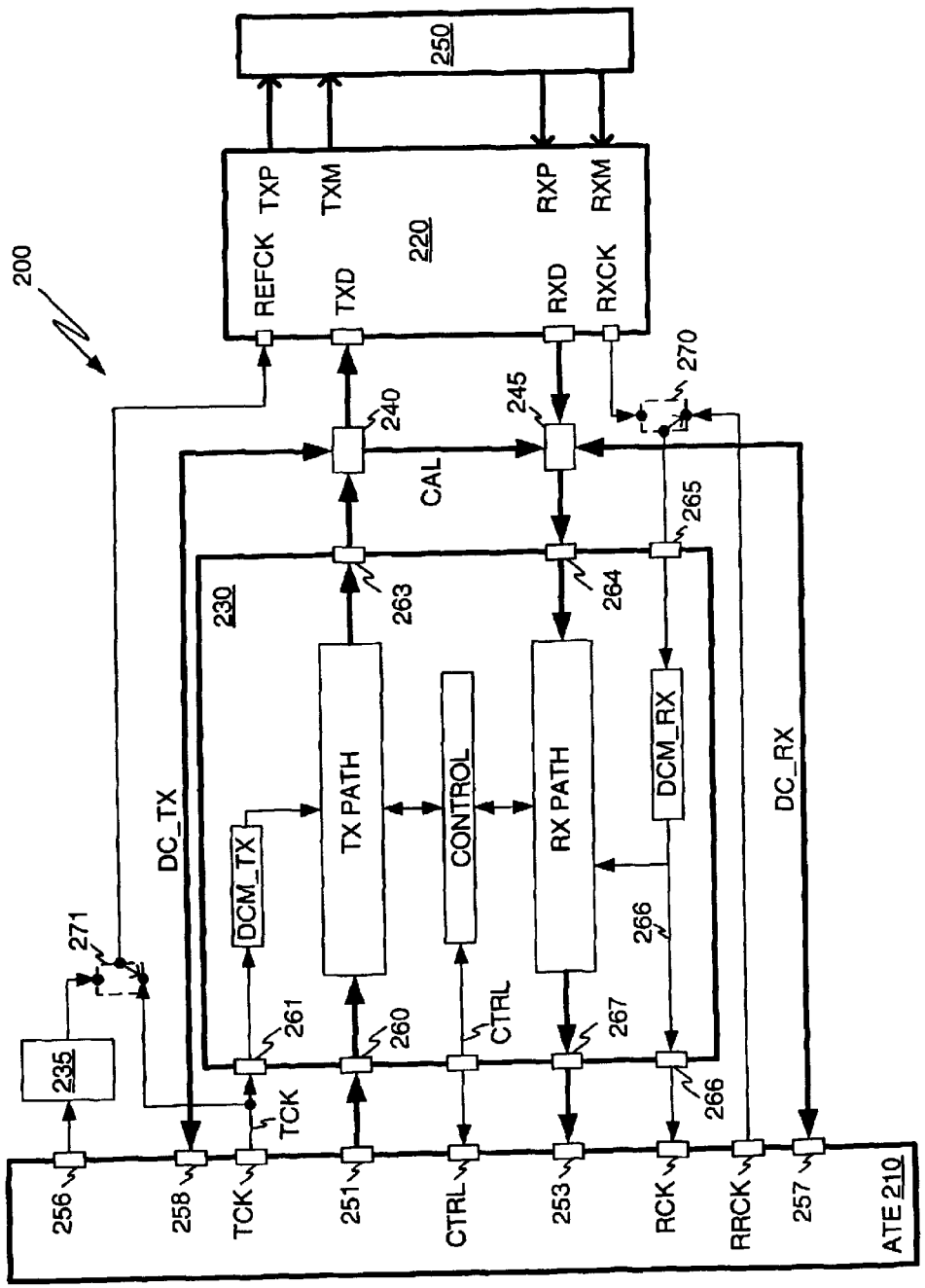
FIG. 2 is a detailed block diagram showing connectivity of the test configuration depicted in FIG. 1.

FIG. 2 is a block diagram of a test configuration 200 similar to test configuration 100 of FIG. 1. Like test configuration 100, test configuration 200 includes an ATE 210 connected to a DUT 220 via a bridge 230. Block diagram 200 additionally includes an external clock source 235, transmit and receive switch boxes 240 and 245, and a high-speed signal connection card 250. The following discussion and referenced features describe the interaction of these elements.

ATE 210 can be an Agilent® 93K™ or a Teradyne® tester with a maximum operating frequency of at least 200 MHz. Bridge 230 can be instantiated on a Xilinx® Virtex-II™ or Virtex-II Pro™ FPGA (field programmable gate array). DUT 220 is, in one embodiment, a high-speed transceiver capable of receiving and transmitting data at 622 MHz in single data rate mode or 311 MHz in double data rate mode. Card 250 is a simple high-speed connection that receives data from output terminals TXP and TXM of DUT 220 and returns that same data to input terminals RXP and RXM, also of DUT 220. External clock 235 is a voltage-controlled clock controlled by ATE 210 to generate a clock with frequency equivalent to the maximum operating frequency of DUT 220, 622 MHz in the present example. A switch 271 may be positioned to convey the externally generated clock signal from clock 235 to DUT 220.

ATE 210 generates and transmits test data, or "test vectors," to bridge 230 through a parallel output port 251. The test vectors are synchronized to a transmission clock TCK from a like-named clock terminal. (In general, signals and their respective nodes, lines, or terminals are similarly named herein. Whether a given reference pertains to a signal or a physical structure will be clear from the context.) ATE 210 receives back the same or different vectors from bridge 230 through a parallel input port 253. The received test vectors are synchronized to a receive clock RCK from a terminal 266 on bridge 230. Bridge 230 derives receive clock RCK from a receive-reference clock RRCK received from ATE 210 via a switch 270.

Bridge 230 receives the test vectors and transmission clock TCK from ATE 210 on a test-vector input port 260 and transmission-clock input port 261, respectively. A transmit path TX increases the transmission frequency of the test vectors, typically to a level greater than the maximum transmission frequency of ATE 210, and conveys the resulting high-speed test vectors to DUT 220 via a parallel output port 263.

The depicted embodiment employs a digital clock manager DCM_TX to derive a test clock for synchronizing the high-speed test vectors. Transmit path TX converts single data rate test vectors to double data rate test vectors to step-up the test vector transmission frequency by a factor of two.

A receive path RX within bridge 230 receives high-speed test data from DUT 220 through a parallel input port 264. A second clock manager DCM_RX synchronizes this test data to receive clock RCK. Receive path RX reduces the transmission frequency of the received test data to a level less than or equal to the maximum transmission frequency of ATE 210. In one embodiment, receive path RX converts DDR test vectors to SDR test vectors to step-down the test vector transmission frequency by a factor of two.

In the depicted embodiment, DUT 220 receives the high-speed test vectors from bridge 230 on transmit-data terminal TXD and relays these vectors to card 250 via terminals TXP and TXM. Card 250 merely returns the received test vectors to terminals RXP and RXM of DUT 220. DUT 220 then conveys the test vectors from card 250 back to bridge 230 via receive-data terminal RXD. ATE 210 controls all operations of bridge 230 via a control bus CTRL connected to some control circuitry CONTROL within bridge 230.

Prior to performance testing DUT 220, ATE 210 is calibrated to account for delays imposed on test vectors by bridge 230. During calibration, switch boxes 240 and 245 connect transmit port 263 to receive port 264 through a calibration bus CAL. ATE 210 then sends calibration test vectors through transmit path TX, from transmit port 263 to receive port 264, and back to ATE 210 through receive path RX. Also during calibration, ATE 210 conveys transmit clock TCK to clock manager DCM_TX and receive-reference clock RRCK to clock manager DCM_RX. ATE 210 then controls clock managers DCM_TX and DCM_RX to adjust the timing of the respective transmit and receive clocks to determine the minimum and maximum clock delays over which bridge 230 returns the correct calibration test vectors. ATE 210 then uses the minimum and maximum delay values to program clock managers DCM_TX and DCM_RX for optimal test-vector transmission. When implemented on an FPGA, receive path RX and transmit path TX timing parameters are expected to remain relatively constant for different boards and environmental conditions.

Once test configuration 200 is calibrated, ATE 210 applies DC test vectors to DUT 220 via buses DC_TX and DC_RX and respective switch boxes 240 and 245. These DC tests conventionally ascertain whether DUT 220 complies with prescribed technical specifications, e.g., electrical continuity, leakage current, LVDS I/O termination resistance, voltage output high, voltage output low, etc. ATE 210 uses control circuit CONTROL to tristate ports 263 and 264 during the DC tests to isolate DUT 220 from bridge 230.

As noted above, ATE 210 issues test vectors to DUT 220 via transmit path TX, DUT 220 returns the test vectors to ATE 210 via receive path RX, and ATE 210 compares the transmitted and received test vectors to ensure they match expected values. DUT 220 and board 250 introduce some unknown quantity of delay, and this delay varies from one DUT to the next. The transmitted and received test vectors must therefore be aligned in time before ATE 210 can test DUT 220 for performance.

The process of aligning transmitted and received test data is conventionally referred to as "frame alignment." In this process, ATE 210 issues a known frame to DUT 220 via transmit path TX. Transmit path TX stores a copy of the frame for later comparison. DUT 220 returns the frame to receive path RX in the manner discussed above. Receive path RX compares data received from DUT 220 with the stored copy of the frame on each rising edge of receive clock RCK and counts the number of edges until receive path RX receives the frame.

If a frame match is not found after some set number of clock edges, ATE 210 adjusts the transmit and receive timing via the clock managers DCM_TX and DCM_RX and once again attempts a frame alignment. This process continues until transmitted and received frames match, or until all acceptable timing permutations fail to produce a match. In the latter case, ATE 210 issues an error signal indicating a problem with test configuration 200.

When a match is found, i.e., the stored copy of the transmitted frame matches a received frame, ATE 210 captures and stores the timing settings employed to achieve the match. These settings, which include the settings for clock managers DCM_TX and DCM_RX and the number of clock cycles of delay imposed by the combination of DUT 220 and card 250, are stored for use in subsequent performance testing. DUT speeds differ, due to process variations, for example, so frame alignment is repeated for every DUT 220. Once ATE 210 and bridge 230 are calibrated, ATE 210 functionally tests DUT 220 through bridge 230 using conventional types of test vectors. Test vectors are selected based upon the needs of DUT 220 using methods well understood by those of skill in the art.

In the foregoing discussion, test configuration 200 operates synchronously with ATE 210 providing both transmit clock TCK and reference-receive clock RRCK. Test configuration 200 is also adapted to operate asynchronously. In that case, ATE 210 still provides transmit clock TCK for transmission path TX timing, but a receive-clock switch 270 selects a receive clock RXCK from DUT 220 for receive path RX timing. Asynchronous operation provides additional test coverage, and more closely mimics the operation of some systems in which some DUT 220 is to be used. In one example, DUT 220, a receiver, interconnects a media access control (MAC) layer and a physical layer (PHY) in. conformance with 10Gb Ethernet communication specifications. The MAC layer provides reference clock REF_CLK to DUT 220, and DUT 220 provides the receive clock RXCK.

Figure 3:
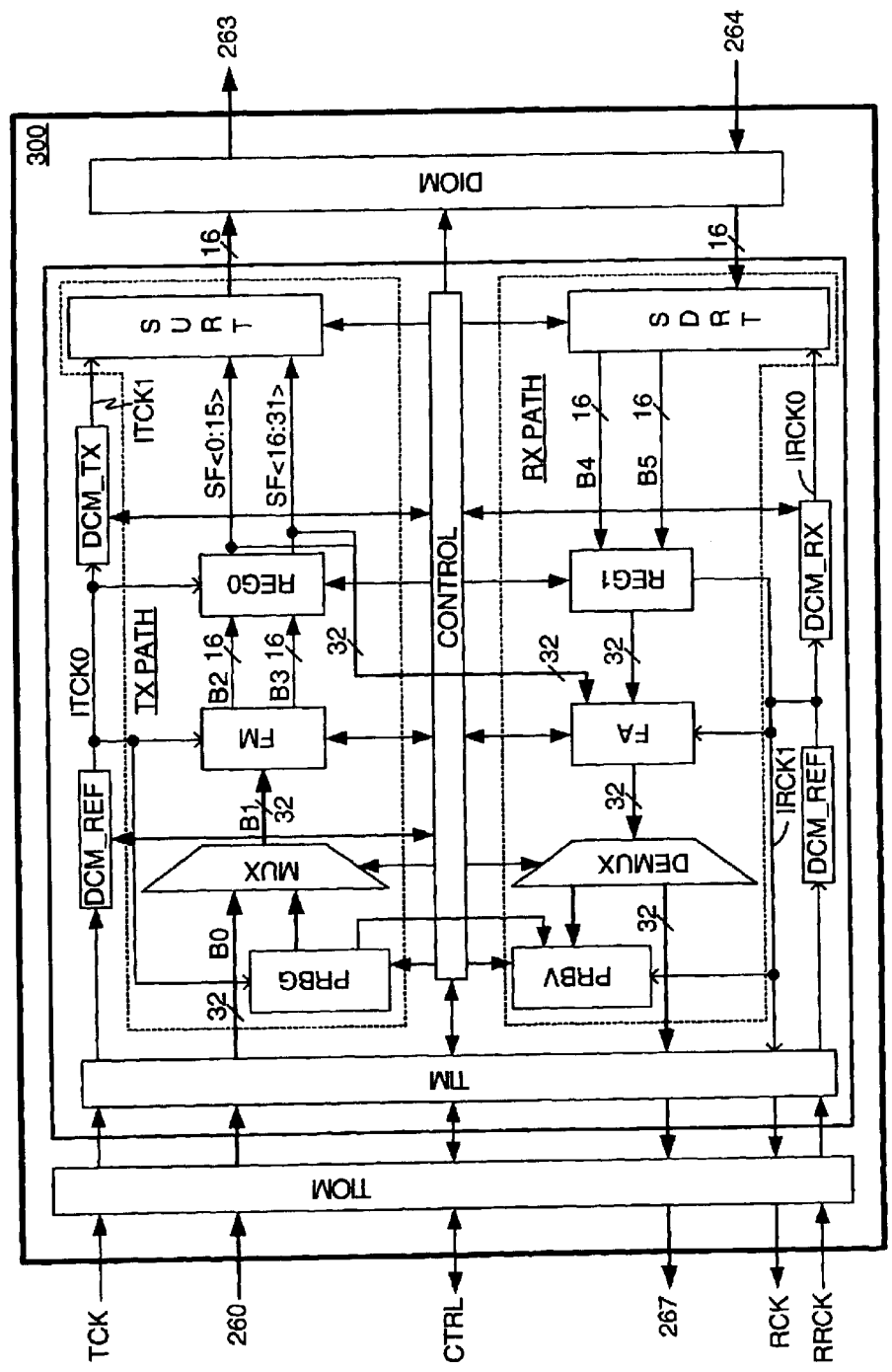
FIG. 3 is a block diagram depicting various modules that implement a bridge circuit.

FIG. 3 is a block diagram depicting a bridge 300 similar to bridge 230 of FIG. 2, like-labeled elements being the same or similar. In this embodiment, bridge 300 is a Virtex-II™ FPGA configured to include retimer, frame-alignment, and bit-error-testing Verilog™ modules.

Xilinx®'s Virtex™ FPGAs feature double data rate registers, digital clock managers (DCMs), and configurable input/output blocks that support various high-performance single-ended and differential I/O standards. Each DCM provides a delay locked loop (DLL) and digital phase shift (DPS) functionality. One supported I/O standard, LVDS (low-voltage differential signaling), is a low-swing, differential signaling technology that provides for fast data transmission, high common-mode noise rejection, and low power consumption over a broad frequency range. For example, Virtex-II™ input/output blocks are capable of sending and receiving LVDS signals at 622 Mbps SDR or 311 Mbps DDR, as noted in the application note entitled "Virtex™-E High-Performance Differential Solutions: Low Voltage Differential Signaling (LVDS)," VTT09, v1.2, which is incorporated herein by reference.

Returning to FIG. 3, bridge 300 includes a tester I/O module (TIOM), which communicates with ATE 210 of FIG. 2, and a DUT I/O module (DIOM), which communicates with DUT 220, also of FIG. 2. Tester I/O module TIOM receives test, clock, and control signals from ATE 210 and conveys these signals to a tester interface module (TIM). In one embodiment, ATE 210 sends data to bridge 300 on a single-ended bus. Tester interface module TIM converts data on the single-ended bus to a differential data for fast and efficient transmission on bridge 300. The resulting input signals are conveyed to various modules for processing in the manner described below. Similarly, interface module TIM converts the differential data from receive path RX to single-ended data, and then conveys the single-ended data, clock, and control feedback to tester I/O module TIOM. DUT I/O module DIOM employs Virtex I/O resources to communicate high-speed LVDS signals between bridge 300 and DUT 220.

In one embodiment, during frame alignment, transmit path TX receives a data frame synchronized to a 156 MHz transmit clock TCK over a 32-bit, differential parallel bus B0. A reference digital-clock-manager (DCM_REF) generates a 156 MHz de-skewed internal clock (ITCK0) from clock TCK that clocks the data through transmit path TX.

A multiplexer MUX passes the data frame to a frame marker module (FM) over a 32-bit-wide bus B1. Frame marker FM inserts delimiters on the data frame to mark the start and end of the frame. Frame marker FM then splits the resulting marked data frame into two subframes and transmits the subframes to a holding register (REG0) over two parallel 16-bit-wide differential buses B2 and B3.

A conventional step-up retimer (SURT) converts the 32-bit SDR data stored in register REG0 to a 16-bit DDR data stream. Retimer SURT receives an internal clock ITCK1 from a digital clock manager DCM_TX. Clock manager DCM_TX derives clock ITCK1 from clock ITCK0 by doubling the frequency of clock ITCK0. Retimer SURT transmits the first sub-frame SF<0:15> from register REG to DUT I/O module DIOM via a highspeed, 16-bit bus on a rising edge of clock ITCK1, and transmits the second sub-frame SF<16:31> on the next rising edge of the same clock. Clock ITCK1 is 312 MHz, so the DDR data from retimer SURT is conveyed at twice the rate of the SDR data from ATE 210. DUT I/O module DIOM receives the DDR data stream from retimer SURT and transmits the DDR data on port 263 in differential LVDS mode.

As discussed in connection with FIG. 2, in the depicted embodiment, bridge 300 receives 16-bit differential LVDS DDR test data at 312 MHz from module DIOM (received from DUT 220 via port 264). The differential LVDS data stream is synchronized to receive-reference clock RRCK from ATE 210. A first clock manager DCM_REF in the receive path de-skews the 156 MHz receive-reference clock RRCK from ATE 210. A second clock-manager DCM_RX derives a 312 MHz internal-receive clock IRCK0 from a de-skewed receive clock IRCK1.

A conventional step-down retimer SDRT converts the parallel 16-bit DDR input data stream to a pair of 16-bit-wide SDR data streams on a respective pair of differential buses B4 and B5 using the 312 MHz clock IRCK0 from clock manager DCM_RX. Retimer SDRT transmits alternating 16-bit subframes of received data on each rising edge of clock ICRK0. Full frames, each consisting of two subframes, are conveyed to a holding register REG1 on two adjacent rising edges of clock IRCK0 via respective 16-bit buses B4 and B5. Register REG1 buffers the data on buses B4 and B5 and conveys the combined subframes as a single 32-bit frame to a frame aligner module FA.

Frame aligner FA compares data received from REG1 with the stored copy of the frame in register REG0 on each rising edge of internal receive clock IRCK1 and counts the number of edges until register REG1 contains the stored frame. In the event of a match, frame aligner FA reports the match and the number of edges of clock IRCK1 required for the test frame to travel from register REG0 to register REG1. This number of edges is a measure of the signal propagation delay through DUT 220 and card 250. If no match is found, ATE 210 either abandons the test or adjusts the timing parameters, as discussed above in connection with FIG. 2, and retries frame alignment.

Subsequent to DC testing and frame alignment, ATE 210 applies conventional test vectors to DUT 220 via bridge 300. Alternatively, the ATE can use bridge 300 to generate, transmit, receive, and verify test vectors. In the depicted embodiment, a pseudo-random-bit generator PRBG, instantiated as a linear-feedback shift register in one embodiment, produces pseudo-random test vectors. A pseudo-random-bit-verifier module PRBV then stores copies of the pseudo-random test vectors and compares the stored copies with test vectors returning from the DUT. To employ the pseudo-random test vectors, multiplexer MUX connects the output of generator PRBG to frame marker FM and demultiplexer DEMUX connects the output of frame aligner FA to pseudo-random-bit verifier PRBV.

In one embodiment, bridge 300 includes a signature generator that performs a one-way hash function (e.g., a cyclic redundancy check) on the transmitted test vectors to produce a unique test signature. Pseudo-random-bit verifier PRBV performs the same function on the received test vectors and compares the resulting return signature with the test signature, and a mismatch indicates an error.

As noted above, bridge circuit 230 effectively extends the operational test frequency of ATE 210. In the illustrative case of FIG. 2, bridge circuit 230 accomplishes this extension by accepting a number of relatively low-frequency test channels from ATE 210 and converting them into a lower number of relatively highfrequency test channels. Bridge circuit 230 can also be adapted to produce the reverse effect where a desired test requires more test channels than are available on ATE 210. In that case, bridge circuit 230 is configured to accept a number of relatively high-frequency test channels from ATE 210 and convert them into a higher number of relatively lowfrequency test channels. Bridge circuit 230 is easily modified to perform either type of bridging functionality in embodiments in which bridge circuit 230 is an FPGA.

While the present invention has been described in connection with specific embodiments, variations of these embodiments will be obvious to those of ordinary skill in the art. For example, the foregoing test configuration describes a bridge circuit instantiated on a Virtex™ FPGA. The FPGA is shown as an "exterior add on" device disposed between relatively slow automatic test equipment and a relatively fast DUT; there are many other ICs that might also be used to instantiate the bridge circuit, and the "exterior add-on" device can be moved into the ATE's housing. The resulting system will have the slow ATE as its back-end, while the bridge circuit would form its front-end. Moreover, the ATE may be incorporated on the same IC as the bridge. Therefore, the spirit and scope of the appended claims should not be limited to the foregoing description.

What is claimed is:

1. A test configuration comprising:
    a device under test (DUT) having a first test interface communicating test data at a first frequency;
    automatic test equipment (ATE) having a second test interface and communicating the test data over the second test interface at a second frequency;
    a frame aligner coupled between the first test interface and the second test interface; and
    a bridge having:
        a first bridge port coupled to the first test interface and communicating with the DUT at the first frequency; and
        a second bridge port coupled to the second test interface and communicating with the ATE at the second frequency.

2. The test configuration of claim 1, wherein the bridge is instantiated on a programmable logic device.

3. The test configuration of claim 1, wherein the second frequency is less than the first frequency.

4. The test configuration of claim 1, wherein the bridge is integrated with the ATE.

5. The test configuration of claim 1, wherein the first frequency and the second frequency are asynchronous.

6. The test configuration of claim 1, wherein the ATE includes a third test interface coupled to the first test interface.

7. The test configuration of claim 6, wherein the third test interface provides DC test signals.

8. The test configuration of claim 1, wherein the bridge further comprises a transmit path operating simultaneously at the first and second frequencies.

9. The test configuration of claim 1, wherein the bridge includes a switch selectively coupling the first bridge port with the first test interface.

10. The test configuration of claim 1, wherein the bridge includes a switch selectively coupling the second bridge port with the second test interface.

11. The test configuration of claim 1, wherein the bridge passes data frames to the DUT over the first test interface, wherein the DUT returns the data frames over the first interface, and wherein the frame aligner compares the passed data frames with the returned data frames.

12. The test configuration of claim 1, wherein the bridge includes a test-vector generator providing test vectors to the DUT over the first test interface.

13. The test configuration of claim 12, wherein the bridge includes a test-vector reference circuit receiving the test vectors from the DUT and comparing the received test vectors to a test reference.

14. The test configuration of claim 1, further comprising a calibration bus for calibrating the ATE.

15. The test configuration of claim 1, wherein the first frequency is provided by a clock signal from the ATE.

16. The test configuration of claim 1, wherein the first frequency is provided by a clock signal from the DUT.

17. A bridge circuit for communicating test data to a device under test, the bridge circuit comprising:
    a first test interface having a first number of test channels communicating the test data at a first test frequency;
    a second test interface having a second number of test channels coupled to the device under test, the second test interface communicating the test data to the device under test at a second test frequency; and
    a frame marker coupled between the first and second test interfaces.

18. The bridge circuit of claim 17, wherein the first number of test channels is greater than the second number of test channels.

19. The bridge circuit of claim 17, wherein the first test frequency is less than the second test frequency.

20. The bridge circuit of claim 17, further comprising at least one pseudo-random bit generator.

21. The bridge circuit of claim 17 instantiated on a programmable logic device.

22. The bridge circuit of claim 17, further comprising a clock-management circuit receiving a first test clock at the first test frequency and deriving, from the first test clock, a second test clock at the second test frequency.

23. The bridge circuit of claim 17, further comprising a step-up retimer coupled between the first and second test interfaces.

24. A test arrangement for testing a device under test (DUT), comprising:
    a test control arrangement configured to provide test data embodied in a first signal at a first frequency;
    a bridge circuit coupled to the test control arrangement, the bridge circuit adapted to generate from the first signal, a second signal at a second frequency that is different from the first frequency, and provide the second signal at a port for input to the DUT.

25. The test arrangement of claim 24, wherein:
    bridge circuit is further adapted to generate from a third signal received from the DUT at a third frequency, a fourth signal at a fourth frequency that is different from the third frequency; and
    the test control arrangement is adapted to receive the fourth signal from the bridge circuit.

26. The test arrangement of claim 25, wherein the bridge circuit is implemented on a programmable logic device.

27. The test arrangement of claim 25, wherein the second frequency is greater than the first frequency, and the third frequency is greater than the fourth frequency.

28. The test arrangement of claim 25, wherein the first frequency and the second frequency are asynchronous, and the third frequency and fourth frequency are asynchronous.

29. The test arrangement of claim 25, wherein the test control arrangement includes a first port and a second port, each arranged to be coupled to the DUT and bypass the bridge circuit, and the test control arrangement is further adapted to provide a DC test signal to the DUT at the first port and receive a DC signal from the DUT at the first signal.

30. The test arrangement of claim 25, wherein the bridge circuit is adapted to pass data frames in the first signal from the test control arrangement, data frames in the second signal to the DUT, and compare data frames in the third signal to data frames in the first signal.

* * * * *